United States Patent [19]

Smith

[11] Patent Number: 5,569,641

[45] Date of Patent: Oct. 29, 1996

[54] SYNTHESIS OF $BI_{1.8}PB_{0.4}SR_2CA_2CU_3O_x$ SUPERCONDUCTOR

[75] Inventor: Michael G. Smith, Los Alamos, N.M.

[73] Assignees: University of California; Los Alamos National Laboratory

[21] Appl. No.: 419,485

[22] Filed: Apr. 10, 1995

[51] Int. Cl.$^6$ .................. C04B 35/622; C04B 35/64; H01B 12/00

[52] U.S. Cl. .................. 505/433; 505/121; 505/501; 505/492; 505/782; 423/593; 252/521

[58] Field of Search .................. 505/121, 230, 505/492, 510, 433, 501, 739, 782; 423/593; 252/518, 521

[56] References Cited

U.S. PATENT DOCUMENTS

| | | | |
|---|---|---|---|
| 5,026,680 | 6/1991 | Sugihara et al. | 505/1 |
| 5,049,541 | 9/1991 | Uzumaki et al. | 505/782 |
| 5,057,488 | 10/1991 | Arendt et al. | 505/1 |
| 5,300,486 | 4/1994 | Hults et al. | 505/501 |
| 5,354,535 | 10/1994 | Dorris et al. | 505/433 |

FOREIGN PATENT DOCUMENTS 6176637  6/1994  Japan.

OTHER PUBLICATIONS

Abstract Only. Smith et al "Synthesis of Ag–clad (Bi, Pb)–2223 tapes by an alternative precursor . . . " Physica C (Amsterdam), 231(3–4) pp. 409–415, 1994. No Month Available.

Primary Examiner—Paul Lieberman
Assistant Examiner—M. Kopec
Attorney, Agent, or Firm—Gemma Morrison Bennett

[57] ABSTRACT

Two-powder processes for the synthesis of superconducting (Bi, Pb)-2223/Ag-clad wires by the oxide-powder-in-the-robe are provided. The first precursor powder, of nominal stoichiometry $CaCuO_x$, is a solution-synthesized mixture of $Ca_{0.45}Cu_{0.55}O_2$ and CaO. Using these oxide precursor mixtures, superconducting tapes with well-aligned grains and reproducible critical current densities $J_c$ in the range of 20,000 to 26,000 A/cm$^2$ at 75 K in self-field after annealing less than 200 hours were obtained.

3 Claims, 2 Drawing Sheets

SYNTHESIS OF $BI_{1.8}PB_{0.4}SR_2CA_2CU_3O_x$ SUPERCONDUCTOR

This invention was made with government support under Contract No. W-7405-ENG-36 awarded by the U.S. Department of Energy. The government has certain rights in the invention.

FIELD OF THE INVENTION

The present invention relates to field of ceramic cuprate superconductors and more particularly to a precursor composition for synthesis of a BiPbSrCaCuO superconductor.

BACKGROUND OF THE INVENTION

There continues to be strong interest in the development of high temperature superconducting wires and tapes for applications such as magnets, transmission lines and magnetic energy storage systems. The superconducting material most usually employed for these tapes and wires is a 2-2-2-3 phase of lead-doped bismuth-strontium-calcium-copper oxide wherein the numbers represent the approximate respective molar ratios of the bismuth, strontium, calcium and copper substituents. In a typical wire preparation, a partially sintered powder, i.e., a powder consisting primarily of a combination of 2-2-1-2 phase bismuth-strontium-calcium copper oxide and other calcium, copper and lead-containing phases that will yield the desired 2-2-2-3 phase upon subsequent sintering, is loaded into a tube, e.g., a silver (Ag) tube, and then mechanically deformed into a thin wire and/or tape. After deformation, the final conversion via sintering to the 2-2-2-3 phase takes place.

U.S. Pat. No. 5,300,486 discloses and teaches various processes for the preparation of superconductors such as the lead-doped bismuth-strontium-calcium-copper oxide superconductor including preparation from the respective metal carbonates, metal oxides or metal nitrates. While such processes are known, these processes typically involve long sintering stages of about 300 hours or longer. Thus, there remains a need for further simple, economical processes that will enable the preparation of the 2-2-2-3 lead-doped bismuth-strontium-calcium-copper oxide product. U.S. Pat. No. 5,300,486 uses a relatively inert material $Sr_9Ca_5Cu_{24}O_{41}$ as a principal component, along with Bi-4334 and $Ca_{2-x}Sr_xPbO_4$, where x has a value between 0–2. This mixture is slow to react and requires long annealing times (>300 hours) to form the Bi-2223 phase in wires while this invention uses the highly reactive material $Ca_{0.45}Cu_{0.55}O_2$ as a precursor phase. This phase decomposes rapidly in the presence of the other precursor phases (Bi-2212, $Ca_2PbO_4$, and CuO) in the silver matrix. The resulting chemical reaction forms the superconducting Ag-clad Bi-2223 wire, in a much shorter time (<200 hours).

Applicants show that (Bi,Pb)-2223/Ag-clad wires can be synthesized with average critical current of 20,000 A/cm$^2$ using a two-powder mixture of the $Bi_{1.8}Pb_{0.4}Sr_2CaCu_2O_8$ phase combined with a $Ca_{0.45}Cu_{0.55}O_2$ and CaO powder. In addition, applicants have prepared the $Bi_{1.8}Pb_{0.4}Sr_2CaCu_2O_8$ powder with a relatively high Pb content and less $Ca_2PbO_4$. Annealing time is about 192 hours or ⅓ less than that of the process of U.S. Pat. No. 5,300,486.

Accordingly, it is an object of the present invention to provide a method of synthesizing a BiSrPbCaCuO superconductor material.

Still another object of the invention is to provide a first precursor mixture of calcium copper oxide, and calcium oxide and a second precursor mixture of $BiSr_2CaCu_2O_x$= 8.9, and $Ca_2PbO_4$.

SUMMARY OF THE INVENTION

To achieve the foregoing and other objects, and in accordance with the purposes of the present invention, as embodied and broadly described herein, the present invention provides a composition of matter useful as a precursor mixture for subsequent processing into a high temperature superconductive product.

Two-powder process for the synthesis of superconducting (Bi,Pb)-2223/Ag-clad wires by the oxide-powder-in-the-tube (OPIT) process is described. The first powder, of nominal stoichiometry $Bi_{1.8}Pb_{0.4}Sr_2CaCu_2O_8$, is a mixture of (Bi,Pb)- 2212 and $Ca_2PbO_4$. The second powder, of nominal stoichiometry $CaCuO_2$, is a solution-synthesized mixture of $Ca_{0.45}Cu_{0.55}O_2$ and CaO. Using these oxide precursor mixtures superconducting tapes were obtained with well-aligned grains, and reproducible critical current densities ($J_c$) in the range of 20,000–26,000 A/cm$^2$ at 75K in self-field after anneals at 815° C. in 10% oxygen ($O_2$) in less than 200 hours. The decrease in annealing time, relative to other two-powder processes, is due to the increase in reactivity and reaction paths of the $Ca_{0.45}Cu_{0.55}O_2$ precursor.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

Figure 1:
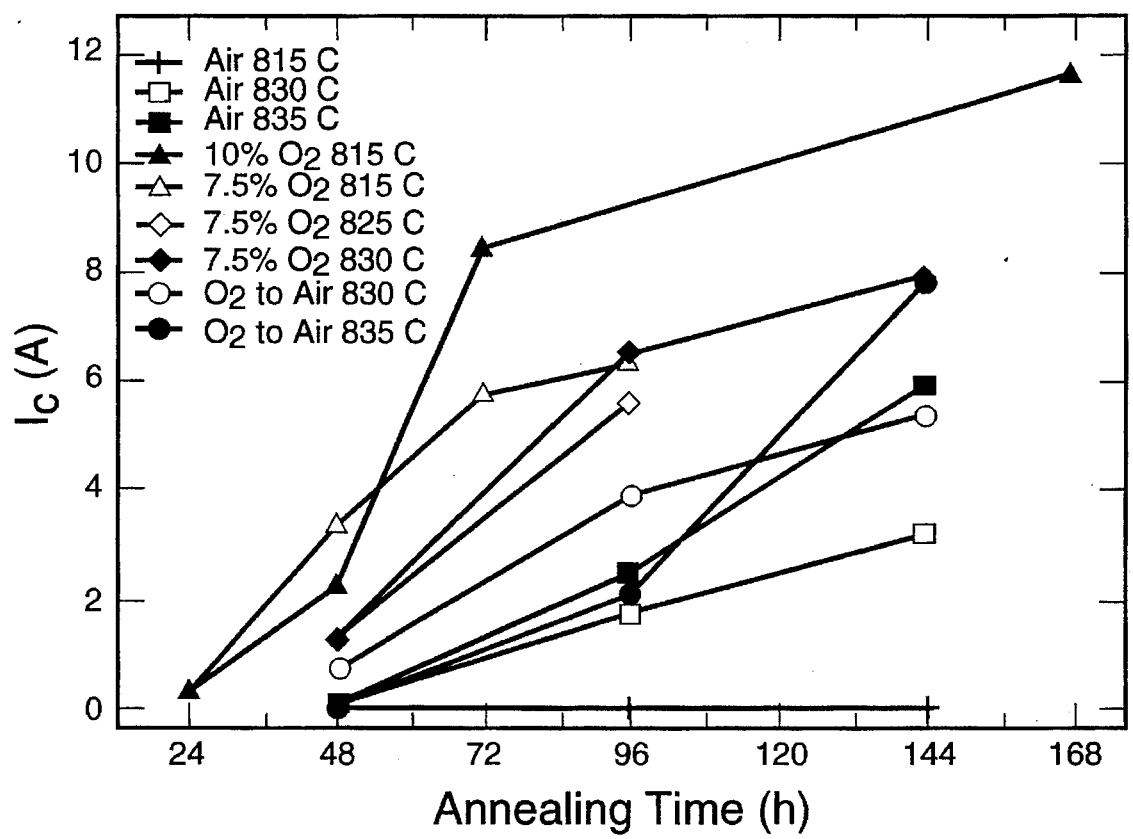
FIG. 1 is a graph showing critical current ($I_c$) at 75K in self field of 127 μm tapes of this invention annealed under various conditions versus annealing time.

Nominal $Bi_{1.8}Pb0.4Sr_2CaCu_2O_x$ powder, where x has a value of 8 to 9, is annealed at 800° C. in 7.5% $O_2$/92.5% Ar for 24 hours then reground and annealed at 810° C. in 7.5% $O_2$/92.5% Ar for 24 hours. The $Ca_{0.45}Cu_{0.5}O_2$+CaO(1:1 "$CaCuO_2$") precursor mixture was prepared by sol-gel synthesis. Stoichiometric amounts of dried $CaCO_3$ and CuO are dissolved in warm dilute nitric acid. Citric acid is then added to the solution. The solution is slowly dried for 24 hours on a hot plate. The resulting brown powder is ground with a mortar and pestle, placed in an alumina crucible, and then slowly heated to 700° C. (1° C./min) in flowing oxygen. After 12 hours the powder is removed from the furnace, reground, and pressed into pellets. The pellets are then annealed at 715° C. in flowing oxygen for 113 hours with 3 intermediate grindings and pressing, and slow-cooled to room temperature (1° C./min). Standard particle size analysis of the precursor phases showed that the average particle sizes of the Bi-2212 precursor and "CaCuO2" precursor mixture were 4 and 7 μm, respectively. Analysis of the latter precursor showed at least 50% of the sample had particle sizes less than 2 μm. The remainder of the material appeared to agglomerate into particles of average size 12 μm. Carbon content of the Bi- 2212 precursor and "CaCuO$_2$" precursor mixture were 0.04 and 0.05 weight percent, respectively. A mixture of the precursor powders is then premixed by tumbling for 5 hours to give an overall stoichiometry of Bi$_{1.8}$Pb$_{0.4}$Sr$_2$Ca$_2$Cu$_3$O$_x$, where x is a value of 10 to 11. The Ag-clad (Bi-Pb)-2223 tape is fabricated by the oxide-powder-in-tube process. A 99.99% pure silver tube (13.7 mm OD×9.27 mm ID) with a blind-hole is etched with nitric acid, ultrasonically cleaned, then manually packed with the 7.49 g of precursor mix in a dry helium atmosphere. This represented an as-packed density of 1.88 g/cm$^3$. The tube is sealed by electron-beam welding a silver plug into the open end. The billet is then wire-drawn to 1 mm diameter in 37 passes, employing 20° included-angle dies. Tape is produced from this wire by rolling to various thicknesses using 38 mm diameter rolls without lubrication. Approximate rolling reductions are 20% per pass to 0.5 mm thickness, then 15% per pass to 200 µm, and finally 10% per pass to 166, 127, 99, 76, and 51 µm. Samples approximately 3 cm long are cut from the tapes and annealed under various conditions of oxygen. Thermomechanical processing of the tapes begin with 24 hour anneals in calibrated furnaces at temperatures between 815° C. and 835° C. in flowing gas. The tapes are then uniaxially cold pressed at 100 ksi. The tapes are subsequently annealed for 24 hour time periods at the same temperature and PO$_2$. After each annealing period the tapes are uniaxially cold pressed at 150 ksi. When the furnace reaches the processing temperature, the oxygen is turned off and the tapes are allowed to anneal in static air. Subsequent anneals for these tapes are also in air. Magnetic susceptibility of each tape is measured in a SQUID magnetometer operating at an applied field of 10 oersted (Oe). The critical current ($I_c$) of each tape is measured at 75K in self field using the four-probe method and a 1 µV/cm criterion. Tapes are polished by traditional means, ending with colloidal silica in water, and examined in both reflecting light and analytical scanning electron microscopes. The superconductor cross sectional areas are determined by optical image analysis to allow calculation of the critical current density ($J_c$) values. The Bi$_{1.8}$Pb$_{0.4}$Sr$_2$CaCu$_2$O$_x$ powder, where x is a value of 8 to 9, shows that this precursor consisted primarily of (Bi,Pb)- 2212 with small amounts (<5 volume percent) of Bi-2201 and Ca$_2$PbO$_4$. The final anneal step for the powder at 810° C. in 7.5% O$_2$/92.5% argon (Ar) results in substantial decomposition of the Ca$_2$PbO$_4$ phase with the Pb. Reducing conditions raise the Pb solubility in the Bi superconductors. The excess Pb may also be incorporated in the Bi-2201 at this higher temperature and lower effective PO$_2$. The 1:1 "CaCuO$_2$" precursor mixture shows that the only phases present are Ca$_{0.45}$Cu0.55O$_2$ and CaO.

Critical currents $I_c$ (75K, 0 T) of 127 µm tapes prepared under various conditions of PO$_2$ and annealing temperature as a function of annealing time are shown in FIG. 1. The data indicate that the optimum annealing conditions for the precursor mixture of this invention are near 815° C. in 10% O$_2$. Also, tapes that were initially furnace ramped in 100% O$_2$, then further annealed in air generally have greater critical currents than tapes that were only annealed in air.

Figure 2:
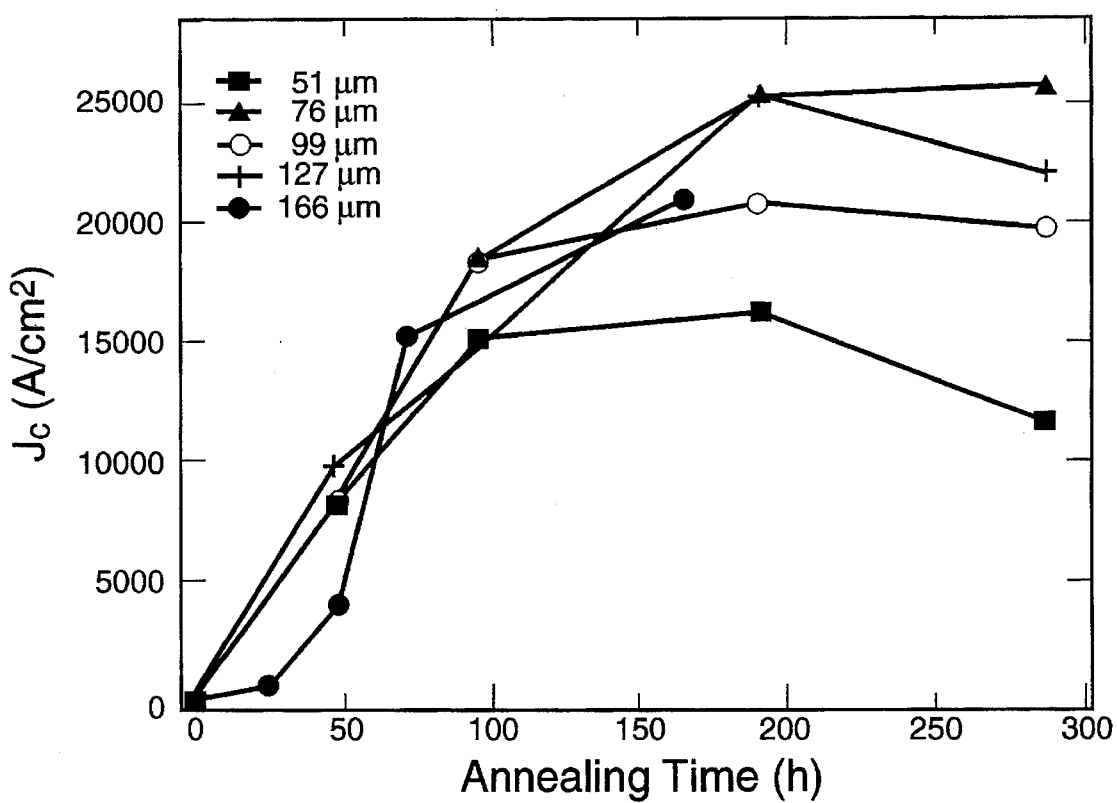
FIG. 2 is a graph showing critical current density ($J_c$) at 75K in self field of tapes of this invention at various thicknesses versus annealing time at a temperature of 810° C. in 10% $O_2$.

Critical current density $J_c$ (75K, 0 T) of tapes prepared under various conditions of initial tape thickness and annealing time are shown in FIG. 2. Optimum initial tape thickness appears to be approximately 76 µm. The critical current density is generally maximized near 192 hours. Applicants routinely observe critical current densities in the range 20,000–26,000 A/cm$^2$ at 75K in a self-field.

Critical current measurements indicate that the optimum annealing conditions for the formation of (Bi,Pb)-2223 from precursor mixture of this invention are near T=815° C. in 10% O$_2$ for approximately 192 hours with four intermediate pressings. More than four cycles of pressing and annealing result in cracks which are not healed by additional heating.

This invention involves a two-powder synthesis consisting primarily of Bi$_{1.8}$Pb$_{0.4}$Sr$_2$CaCu$_2$O$_x$, where x is a value of 8 to 9, and Ca$_{0.45}$Cu$_{0.55}$O$_2$. Optimum transport properties of 20–26 kA/cm$^2$ are obtained in tapes of 76 to 166 µm thickness after several intermediate annealing steps. The choice of Ca$_{0.45}$Cu$_{0.55}$O$_2$ as one of precursor phases is advantageous for two reasons. First, the synthesis of this phase permits the tailoring of the Ca content through the introduction of CaO and, hence, the stoichiometry of the (Bi,Pb)-2223 superconductor. Second, the decomposition temperature of Ca$_{0.45}$Cu$_{0.55}$O$_2$ is sensitive to the oxygen partial pressure. Finally, mixing techniques which reduce agglomeration result in improved tape reaction and performance.

The table shows the key features of this invention as compared with the prior art.

TABLE

|  | Bi-2223 TAPES OF THIS INVENTION | PRIOR ART Bi-2223 TAPES |
| --- | --- | --- |
| Processing time | 192 h | 300 h |
| Critical current density ($J_c$) at T = 75 K, H = O T | 26,000 A/cm$^2$ | 1,000 A/cm$^2$ |
| Critical current density ($J_c$) at T = 4 K, H = O T | 122,000 A/cm$^2$ | — |
| Length | 2.54 cm | — |
| Consistency of method | reproducible | not reproducible |
| No. samples tested | 50 | — |
| No. properties measured | 5 | — |

Using the oxide precursor mixtures of this invention, superconducting tapes with well-aligned grains, and reproducible critical current densities $J_c$ in the range of 20,000 to 26,000 A/cm$^2$ at 75K in self-field after annealing for less than 200 hours were obtained. The decrease in annealing time relative to other two-powder processes, is believed to be due at least in part to the increase in reactivity and reaction paths of the Ca$_{0.45}$Cu$_{0.55O2}$ precursor.

Although the present invention has been described with reference to specific details, it is not intended that such details should be regarded as limitations upon the scope of the invention, except as and to the extent that they are included in the accompanying claims.

What is claimed is:

1. A method of synthesizing superconducting Bi$_{1.8}$Pb$_{0.4}$Sr$_2$Ca$_2$Cu$_3$O$_x$ comprising: (a) combining a first precursor mixture of Ca$_{0.45}$Cu0.55O$_2$ and CaO with a second precursor mixture of Bi$_{1.8}$Pb$_{0.4}$Sr$_2$CaCu$_2$O$_x$ wherein x is 8 to 9 inclusive and Ca$_2$PbO$_4$, in the amounts necessary to achieve the desired stoichiometry of said superconducting Bi$_{1.8}$Pb$_{0.4}$Sr$_2$Ca$_2$Cu$_3$O$_x$, to form a homogenous mixture; (b) packing and sealing a silver tube with said homogenous mixture; (c) annealing said silver tube: and (d) drawing said tube to a desired thickness.

2. The method of claim 1 wherein said first precursor mixture is made by sol-gel precipitation of CaCO$_3$ and CuO.

3. The method of claim 1 wherein said annealing is accomplished in less than about 200 hours and the temperature is in the range from about 800° C. to about 835° C.

* * * * *

UNITED STATES PATENT AND TRADEMARK OFFICE
CERTIFICATE OF CORRECTION

PATENT NO. : 5,569,641
DATED : October 29, 1996
INVENTOR(S) : Michael G. Smith, Jeffrey O. Willis, Dean E. Peterson Page 1 of 1

It is certified that error appears in the above-identified patent and that said Letters Patent is hereby corrected as shown below:

Title page,
Please delete "SYNTHESIS OF $BI_{1.8}PB_{0.4}SR_2CA_2CU_3O_x$ SUPERCONDUCTOR" and substitute therefor -- SYNTHESIS OF $Bi_{1.8}Pb_{0.4}Sr_2Ca_2Cu_3O_x$ SUPERCONDUCTORS --.
Please delete "Inventor: Michael G. Smith, Los Alamos, N.M." and substitute therefor -- Inventors: Michael G. Smith, Jeffrey O. Willis, and Dean E. Peterson, Los Alamos, N.M. --.

Abstract,
Line 3, please delete "robe" and substitute therefor -- tube --.

Column 2,
Line 46, please delete "$Bi_{1.8}Pb0.4SR_2Ca_2Cu_3O_x$" and substitute therefor
-- $Bi_{1.8}Pb_{0.4}Sr_2Ca\ Cu_2\ O_x$ --.

Column 3,
Line 50, please delete "$Ca_{0.45}Cu0.55O_2$" and substitute therefor -- $Ca_{0.45}Cu_{0.55}O_2$ --.

Column 4,
Line 44, please delete "$Ca_{0.45}Cu_{0.55}0_2$" and substitute therefor -- $Ca_{0.45}Cu_{0.55}O_2$ --.
Line 53, please delete "$Ca_{0.45}Cu0.55O_2$" and substitute therefor -- $Ca_{0.45}Cu_{0.55}O_2$ --.
Lines 55-56, please delete "wherein x is 8 to 9 inclusive" and substitute therefor
-- wherein x is from 8 to 9, --.

After Column 4,
Line 65, please add -- 4. The method of Claim 1 wherein x is in the range from about 8 to about 11 and y is in the range from about 0.2 to about 0.4 --.

Signed and Sealed this

Twenty-fifth Day of September, 2001

*Attest:*

NICHOLAS P. GODICI
*Attesting Officer*     Acting Director of the United States Patent and Trademark Office